United States Patent [19]

March

[11] Patent Number: 5,710,513

[45] Date of Patent: Jan. 20, 1998

[54] CIRCUIT BREAKER TESTING APPARATUS HAVING ADJUSTABLE INDUCTOR FOR CONTROLLING MAGNITUDE OF CURRENT FLOW

[76] Inventor: James M. March, 612 Willow, St. Marys, Kans. 66536

[21] Appl. No.: 568,939

[22] Filed: Dec. 7, 1995

[51] Int. Cl.[6] ................................................ G01R 31/02
[52] U.S. Cl. ........................................ 324/424; 340/638
[58] Field of Search ............................ 324/424; 340/638

[56] References Cited

U.S. PATENT DOCUMENTS

| | | | |
|---|---|---|---|
| 3,532,967 | 10/1970 | Milton et al. | 324/28 |
| 3,646,438 | 2/1972 | Staff | 324/72.5 |
| 3,678,372 | 7/1972 | Elder | 323/45 |
| 4,209,739 | 6/1980 | Paige | 324/424 |
| 4,646,003 | 2/1987 | Phillips et al. | 324/74 |
| 4,814,712 | 3/1989 | Burton et al. | 324/424 |
| 4,998,067 | 3/1991 | Puckett et al. | 324/424 |
| 5,270,658 | 12/1993 | Epstein | 324/424 |
| 5,272,438 | 12/1993 | Stumme | 324/424 |
| 5,334,939 | 8/1994 | Yarbrough | 324/424 |
| 5,604,437 | 2/1997 | Moncorge et al. | 324/424 |

*Primary Examiner*—Michael Brock
*Attorney, Agent, or Firm*—Flanagan & Flanagan

[57] ABSTRACT

A circuit breaker testing apparatus includes an electrical circuit, an adjustable inductor connected in the circuit and a transducer for sensing current flow in the circuit. The circuit has leads terminated by electrical connectors for connection to terminals of a circuit breaker for providing a source of electrical power to circuit from the circuit breaker. The inductor is adapted to produce an adjustable electrical load on the circuit breaker. The testing apparatus also includes an indicator connected to the transducer for producing a reading of the magnitude of current flow in the circuit and for displaying and holding the reading of the highest magnitude of current flow reached in the circuit and thereby the magnitude of current flow at which the circuit breaker is tripped by the adjustment of the electrical load on the circuit breaker. A mechanism is provided for adjusting the inductor so as to reduce the electrical load produced on the circuit breaker and thereby increase the magnitude of current flow drawn through the circuit breaker circuit to cause tripping of the circuit breaker. The inductor includes a coil connected in the circuit and a ferromagnetic core being spaced apart and movable relative to the coil so as to continuously vary the impedance of the core to the flow of current in the circuit.

20 Claims, 4 Drawing Sheets

SENSOR IN    CONTROL OUT 5,710,513

CIRCUIT BREAKER TESTING APPARATUS HAVING ADJUSTABLE INDUCTOR FOR CONTROLLING MAGNITUDE OF CURRENT FLOW

BACKGROUND OF THE INVENTION

1. Field of the Invention

The present invention generally relates to devices for testing circuit breakers and, more particularly, is concerned with a circuit breaker testing apparatus employing an adjustable inductor as an adjustable load for controlling the magnitude of current flow through the circuit breaker.

2. Description of the Prior Art

Circuit breakers are generally used in a wide range of instances to prevent surges of current from electrical power sources to electrical devices to prevent damage to these devices. Circuit breakers function by tripping at a predetermined level of current and thereby stopping the flow of electricity from a source to a device. To ensure proper functioning of circuit breakers, devices have been developed over the years to test them. This is advisable because components of circuit breakers may over time need adjustment or replacement in order to maintain responsiveness at desired current levels and to avoid tripping at undesired current levels.

Representative examples of devices used for testing circuit breakers are disclosed in U.S. Pat. No. 3,532,967 to Milton et al., U.S. Pat No. 3,646,438 to Staff, U.S. Pat. No. 3,678,372 to Elder, U.S. Pat. No. 4,209,739 to Paice, U.S. Pat. No. 4,646,003 to Phillips et al., U.S. Pat. No. 4,814,712 to Burton et al., U.S. Pat. No. 4,998,067 to Puckett et al., U.S. Pat. No. 5,270,658 to Epstein, U.S. Pat. No. 5,272,438 to Stumme and U.S. Pat. No. 5,334,939 to Yarbrough. While all of these devices are likely to operate in a manner which achieves their limited objectives in testing circuit breakers, none are believed to provide an optimum solution for carrying out this procedure. Some provide a mode of operation which is too complicated for many users to employ effectively. Others are highly complex and thus costly to manufacture and to purchase for use.

Consequently, a need remains for an improvement in devices used to test circuit breakers which overcomes the aforementioned problems in the prior art without introducing any new problems in place thereof.

SUMMARY OF THE INVENTION

The present invention provides a circuit breaker testing apparatus designed to satisfy the aforementioned needs. The circuit breaker testing apparatus of the present invention employs an adjustable inductor as an adjustable load for controlling the magnitude of current flow through the circuit breaker and thus through the electrical circuit of the testing apparatus connected thereto in order to test and determine the tripping point of the circuit breaker. The testing apparatus is especially easy to use at relatively low cost and with generation of less heat than if a variable resistor were used to control the flow of current through the electrical circuit of the testing apparatus. The lower level of heat production permits the testing apparatus to be enclosed within either a portable hand-held unit or a floor unit having a hand-held control.

Accordingly, the present invention is directed to a circuit breaker testing apparatus which comprises: (a) an electrical circuit having leads terminated by electrical connectors adapted for connection to the terminals of a circuit breaker for providing a source of electrical power to the electrical circuit from the circuit breaker; (b) an adjustable inductor electrically connected in the electrical circuit for producing an adjustable electrical load on the circuit breaker; (c) means for sensing current flow in the internal electrical circuit; (d) indicator means electrically connected to the current sensing means for producing a reading of the magnitude of current flow in the electrical circuit and for displaying and holding the reading of the highest magnitude of current flow reached in the electrical circuit and thereby the magnitude of current flow at which the circuit breaker is tripped by the adjustment of the electrical load on the circuit breaker; and (e) means for adjusting the adjustable inductor so as to reduce the electrical load produced on the circuit breaker and thereby increase the magnitude of current flow drawn through the circuit breaker to cause tripping of the circuit breaker.

More particularly, the adjustable inductor has an electrical conductor coil and a ferromagnetic core each spaced apart from one another and having respective axes extending in substantially parallel relation to one another. The coil is electrically connected in the electrical circuit. The core is movable relative to the coil in first and second opposite directions so as to continuously vary the impedance provided by the core to the flow of current through the coil in the electrical circuit. The inductor adjusting means includes a control knob and a linkage connected to and extending between the control knob and the core of the adjustable inductor. Turning of the control knob causes the linkage to move the core relative to the coil in one of the first and second opposite directions to decrease the impedance provided in the coil by the core and thereby allow the magnitude of the current flow through the circuit to increase until the circuit breaker is tripped. The control knob is spring loaded so as to bias the core to move relative to the coil to a position resulting in the producing of a high impedance in the coil and thus low magnitude of current flow in the electrical circuit. The linkage includes an insulator to prevent the conduction of electricity from the core to the control knob.

Furthermore, the means for sensing current flow in the internal electrical circuit includes a first transducer. The indicator means includes a readout device, such as a digital display, electrically connected to the first transducer and a direct current battery electrically connected to the readout device to provide a source of electrical power to operate the readout device.

Also, the testing apparatus can include another means in the form of a second transducer for sensing current flow in an external electrical circuit connected to the circuit breaker in parallel with the testing apparatus. The external electrical circuit provides a normal electrical load on the circuit breaker and thus draws a normal magnitude of current flow therethrough. This allows the testing apparatus to test large capacity circuit breakers with the adjustable inductor of the testing apparatus only required to provide an electrical load sufficient to raise the magnitude of current flow from the normal magnitude to the higher magnitude needed to cause tripping of the circuit breaker.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which.

DETAILED DESCRIPTION OF THE INVENTION

Figure 1:
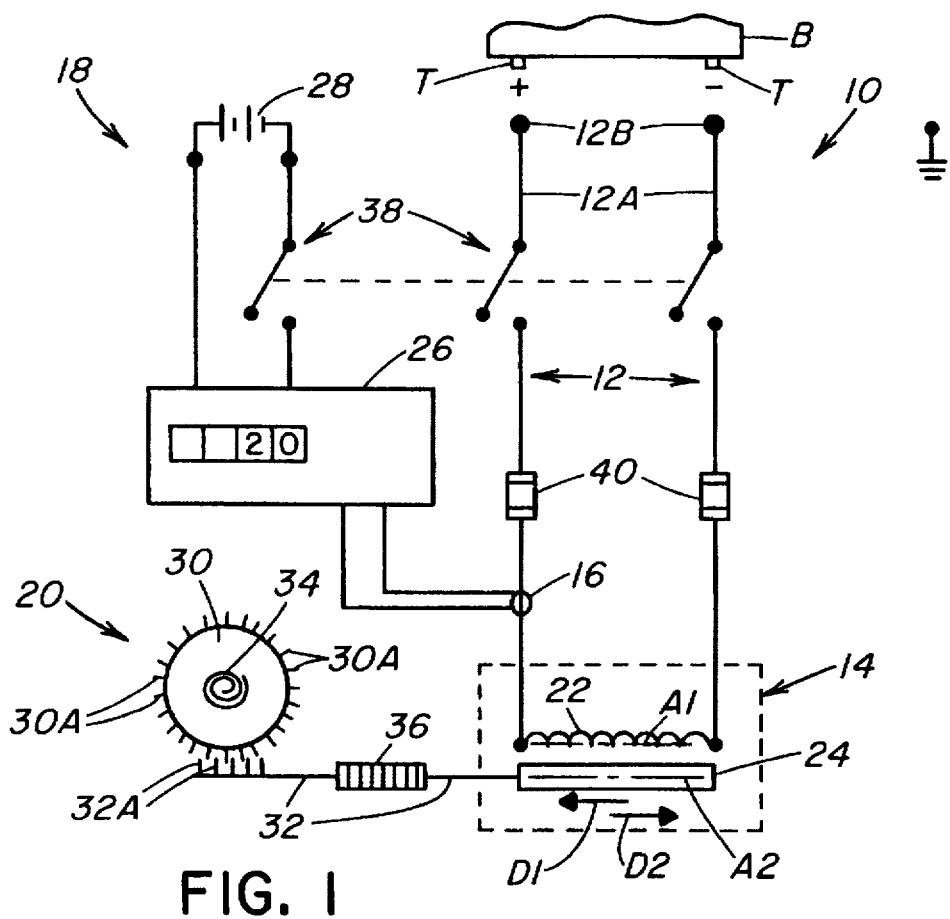
FIG. 1 is an electrical schematic diagram of a first embodiment of a circuit breaker testing apparatus of the present invention in the form of a portable hand-held unit.
Figure 2:
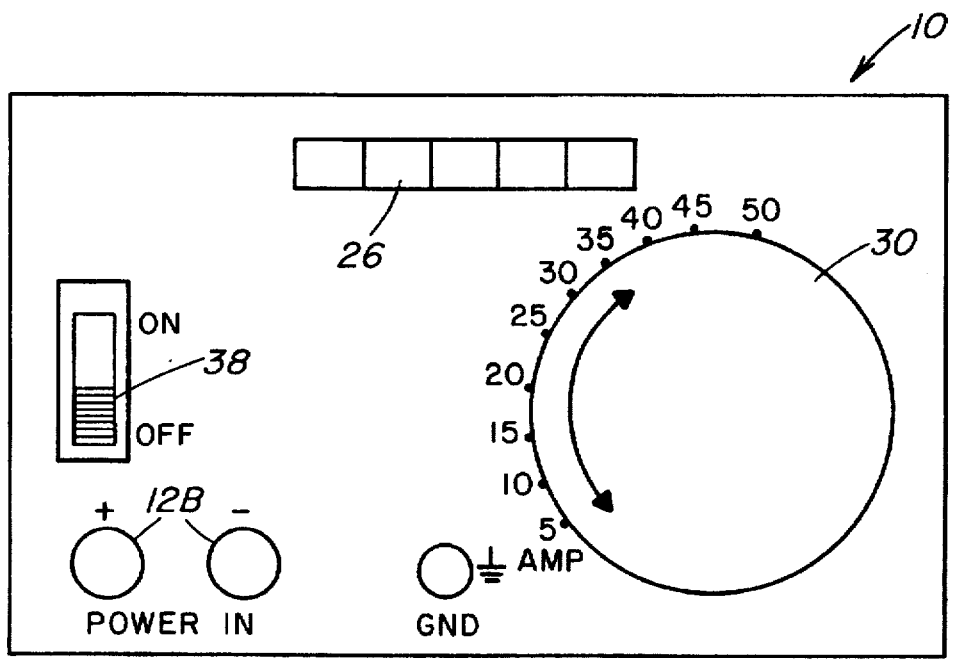
FIG. 2 is a front external view of the first embodiment of the testing apparatus showing the controls of the hand-held unit.

Referring to the drawings and particularly to FIGS. 1 and 2, there is illustrated a circuit breaker testing apparatus, generally designated 10, of the present invention which is operable to adjust an electrical load placed by the testing apparatus 10 on a circuit breaker B undergoing testing so as to increase the magnitude of current flow drawn through a circuit breaker B until the point is reached at which the circuit breaker trips. The testing apparatus 10 is usable with circuit breakers B having a range of different amperage and voltage ratings.

Basically, the testing apparatus 10 includes an electrical circuit 12, an adjustable inductor 14, a current sensor 16, an indicator mechanism 18 and an inductor adjusting mechanism 20. The electrical circuit 12 of the testing apparatus 10 has a pair of leads 12A terminated by electrical connectors 12B, such as alligator clips, which are adapted for connection to terminals T of the circuit breaker B providing a source of electrical power to the electrical circuit 12 from the circuit breaker B being sufficient to operate the testing apparatus 10.

The adjustable inductor 14 of the testing apparatus 10 is electrically connected in the electrical circuit 12 for producing the adjustable electrical load on the circuit breaker B. The adjustable inductor 14 includes an electrical conductor coil 22 electrically connected in the electrical circuit 12 and an elongated core 24 of ferromagnetic material spaced apart from the coil 22. Preferably, the coil 22 and the core 24 have respective axes A1, A2 extending in substantially parallel relation to one another. The core 24 is preferably movable along its axis A2 relative to coil 22 and generally parallel to its axis A1 so as to continuously vary the impedance to current flow through the coil 22 in the electrical circuit 12 until the circuit breaker B is tripped. More particularly, the movement of the core 24 in a first direction D1 relative to the coil 22, such that progressively less of the core 24 is disposed adjacent to the coil 22, decreases impedance produced in the coil 22 by the core 24 and thus increases the current flow through the coil 22 and the electrical circuit 12. One the other hand, the movement of the core 24 in a second opposite direction D2 relative to the coil 22, such that progressively more of the core 24 is disposed adjacent to the coil 22, increases impedance produced in the coil 22 by the core 24 and thus decreases the current flow through the coil 22 and the electrical circuit 12.

The current sensor 16 of the testing apparatus 10 can take any suitable form, for example, a current transducer 16 which is per se conventional and can be a well-known inductance type. The current transducer 16 is adapted to sense current flow in the electrical circuit 12.

The indicator mechanism 18 of the testing apparatus 10 is electrically connected to the current transducer 16 and includes a readout device 26 and a direct current battery 28, for example a nine-volt battery. The readout device 26 is electrically connected to the current transducer 16. The direct current battery 28 is electrically connected to the readout device 26 to provide a source of electrical power to operate the readout device 26. The readout device 26 is adapted to produce a reading of the magnitude of current flow in the electrical circuit 12 and also to display and hold the reading of the highest magnitude of current flow reached in the electrical circuit 12 and thereby the magnitude of current flow at which the circuit breaker B is tripped by the adjustment of the electrical load placed on the circuit breaker B by the adjustable inductor 14. Preferably, the readout device 26 is a digital display which per se can be any of a number of off-the-shelf components.

The inductor adjustment mechanism 20 is adapted to move the core 24 relative to the coil 22 of the adjustable inductor 14 so as to either increase or decrease the electrical load produced on the circuit breaker B by the testing apparatus 10 and thereby either decrease or increase the magnitude of current flow drawn through the circuit breaker B by the testing apparatus 10. The adjustment mechanism 20 basically includes a movable control member 30 and a linkage 32 coupled to and extending between the control member 30 and the core 24 of the adjustable inductor 14. The linkage 32 is connected at one end to an end of the core 24. The linkage 32 is coupled at the other end to the movable control member 30 in any suitable manner such that movement of the control member 30 will translate into a corresponding movement of the linkage 32. Such coupling can take the form of intermeshing sets of teeth 30A, 32A respectively on the control member 30 and linkage 32 as shown diagrammatically in FIG. 1. In one example, the control member 30 is a rotatably mounted knob 30. Clockwise rotation of the knob 30 causes the linkage 32 and thereby the core 24 to move linearly relative to the coil 22 in the first direction D1 to decrease the impedance provided in the coil 22 and thereby permit the magnitude of current flow through the electrical circuit 12 to increase until the circuit breaker B is tripped. Opposite counterclockwise rotation of the knob 30 causes the linkage 32 and thereby the core 24 to move linearly relative to the coil 22 in the second direction D2 so as to increase the impedance in the coil 22 and thereby cause the magnitude of current flow through the electrical circuit 12 to decrease. More particularly, the rotatable control knob 30 is biased by a coiled biasing spring 34 to rotate counterclockwise toward the position relative to the coil 22 at which the high impedance is produced therein and thus a low magnitude of current flow occurs in the electrical circuit 12. The linkage 32 also includes an insulator 36 which is provided to prevent conduction of electricity from the core 24 to the control knob 30.

The testing apparatus 10 further includes an on/off switch 38 electrically connected in the electrical circuit 12 and actuatable so as to open and close the electrical circuit 12.

The switch 38 also is operable to open and close the circuit connection between the battery 28 and the readout device 26. The switch 38 can take the form of a circuit breaker switch being of size to accommodate the magnitude of the particular current flow of the testing apparatus 10. Additionally, the testing apparatus 10 has a high temperature and current auto-reset fuse 40 electrically connected in the electrical circuit 12.

Figure 3:
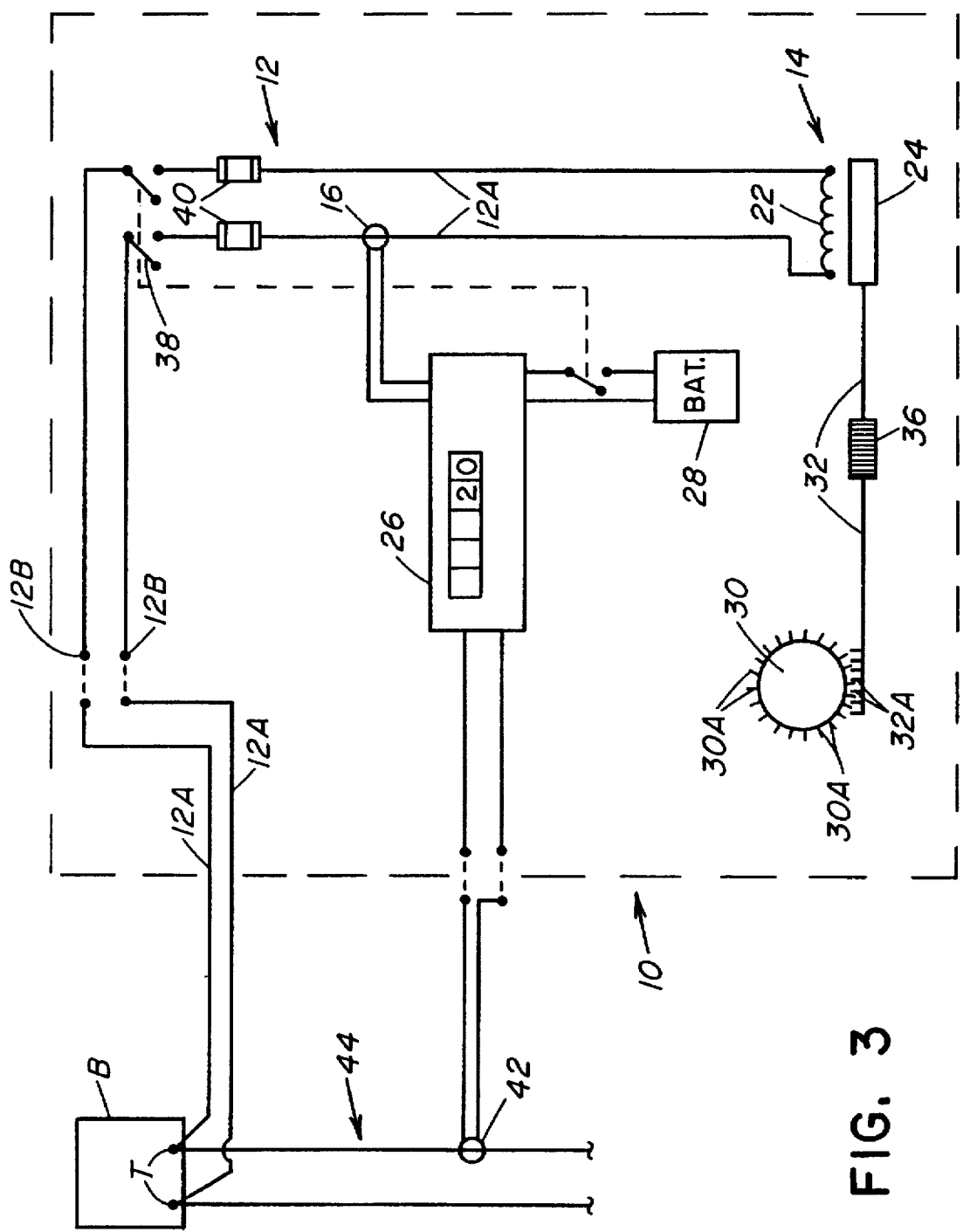
FIG. 3 is an electrical schematic diagram of a modified form of the first embodiment of the circuit breaker testing apparatus.

Referring to FIG. 3, there is illustrated a modification of the first embodiment of the testing apparatus 10 wherein the apparatus 10 is adapted to draw only a portion of the current flow necessary to trip the circuit breaker B. In this case, a second current transducer 42 is provided for sensing current flow in an external electrical circuit 44 which is electrically connected to the circuit breaker B in parallel with the electrical circuit 12 of the testing apparatus 10. The external electrical circuit 44 provides a known normal electrical load on the circuit breaker B and thus draws a known normal magnitude of current flow therethrough. The second transducer 42 is for monitoring the normal current flow through the external circuit 44. The readout device 26 is electrically connected to the second current transducer 42 for receiving therefrom a signal representing the magnitude of the current flow in the external circuit 44 and adding that magnitude to the magnitude of the current flow in the electrical circuit 12 of the testing apparatus 10. With such arrangement, the adjustable inductor 14 of the testing apparatus 10 is only required to provide an additional electrical load sufficient to raise the magnitude of current flow from the known normal magnitude to a higher magnitude sufficient to cause tripping of the circuit breaker B.

Referring to FIGS. 4A, 4B, 5 and 6, there is illustrated a second embodiment of the testing apparatus 10 wherein the components that are the same as in the first embodiment are identifed by the same reference numerals. The second embodiment of the testing apparatus 10 is separated into a hand-held section 10A shown in FIG. 4A and a floor section 10B shown in FIG. 4B. The floor section 10B contains the adjustable inductor 14 and in addition thereto contains a blower 46 and a small motor 48, such as a nine-volt direct current motor, which is used to drive the linkage 32 which moves the core 24 instead of it being done manually as before. Also, the hand-held section 10A includes a variable resistor 50 which is adjusted to control the voltage applied to the motor 48. The more voltage supplied to the motor 48, the farther it moves the core 24 in the first direction D1 causing an increased current flow through the coil 22 and the circuit breaker B being tested. The blower 46 is employed to exhaust any heat from the floor section 10B through the grill 52 shown in FIG. 6.

Figure 7:
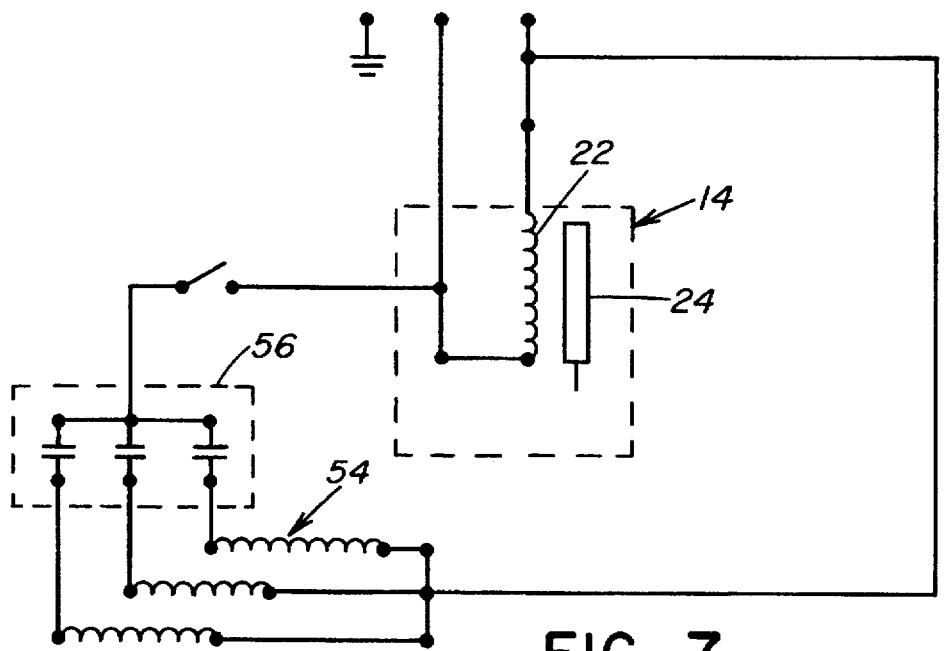
FIG. 7 is an electrical schematic diagram of a modified form of the second embodiment of the circuit breaker testing apparatus.

Also, referring to FIG. 7, there is shown an arrangement of resistors 54 and a selector switch 56 provided in parallel with the adjustable inductor 14 and switched on when it is desired to draw a still higher magnitude of current flow from a circuit breaker B for testing circuit breakers of even larger capacity.

Figure 4A:
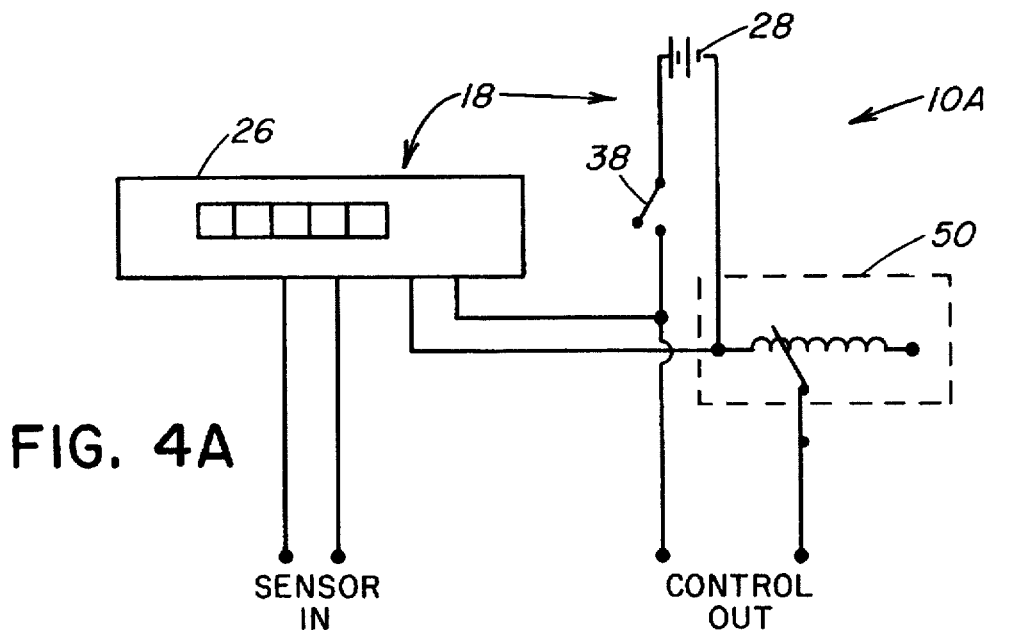
FIGS. 4A and 4B are electrical schematic diagrams of a second embodiment of the circuit breaker testing apparatus in the form of a floor unit with FIG. 4A showing a hand-held control section thereof and FIG. 4B showing a floor section thereof.
Figure 4B:
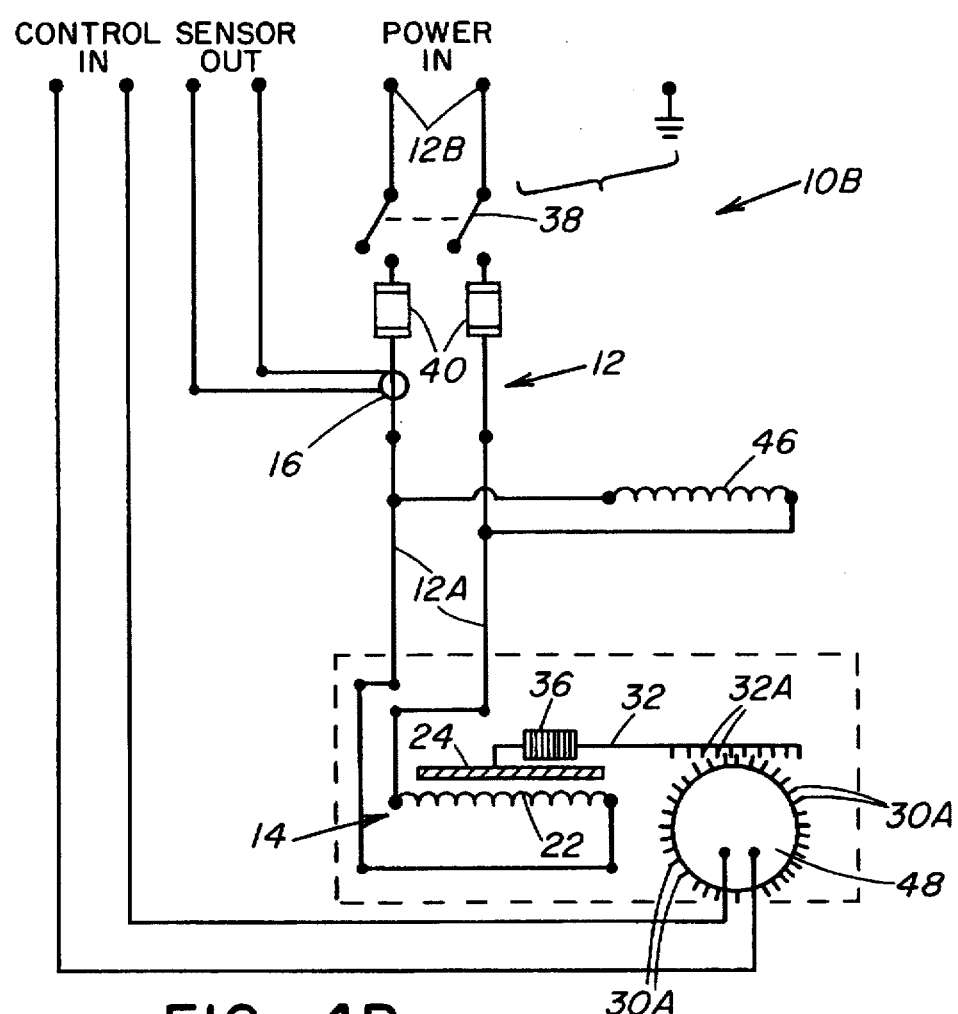
Figure 5:
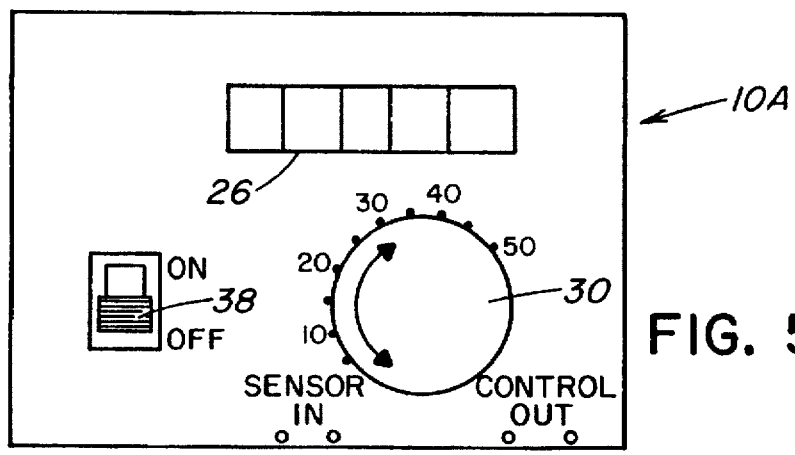
FIG. 5 is a front external view of the second embodiment of the testing apparatus showing the controls of the hand-held section of the floor unit of FIG. 4A.
Figure 6:
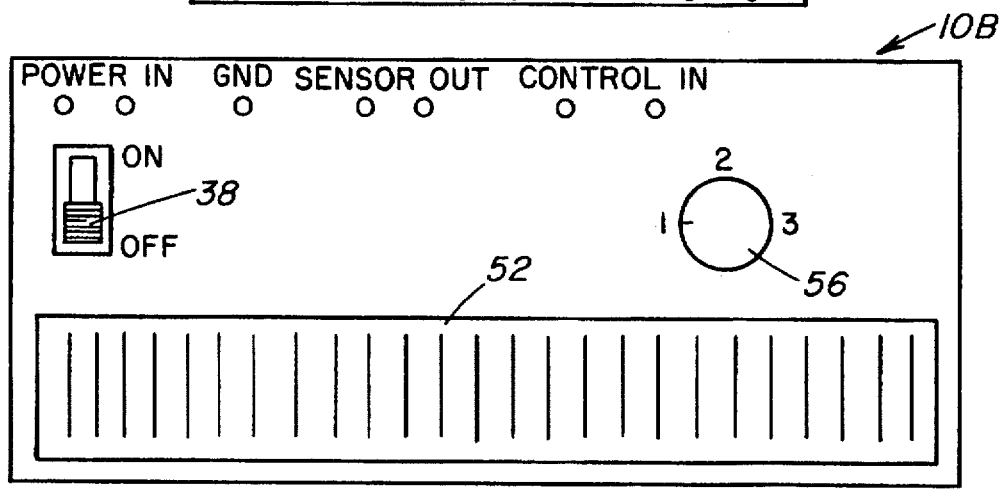
FIG. 6 is a front external view of the second embodiment of the testing apparatus showing the controls of the floor section of the floor unit of FIG. 4B.

In summary, the circuit breaker testing apparatus 10 of the present invention advantageously employs an adjustable inductor 14 to provide an adjustable load for controlling the magnitude of current flow drawn through the circuit breaker B and thus into the electrical circuit 12 of the testing apparatus 10 connected thereto in order to test and determine the tripping point of the circuit breaker B. The testing apparatus 10 is especially easy to use at relatively low cost and with generation of less heat than if a variable resistor were used to control the flow of current through the electrical circuit 12 of the testing apparatus 10. The lower level of heat production permits the testing apparatus 10 to be enclosed within either a portable hand-held unit, as shown in FIGS. 1 and 2, or a floor unit having a hand-held control section 10A, as shown in FIG. 4A and a floor section 10B, as shown in FIG. 4B.

It is thought that the present invention and its advantages will be understood from the foregoing description and it will be apparent that various changes may be made thereto without departing from the spirit and scope of the invention or sacrificing all of its material advantages, the form hereinbefore described being merely preferred or exemplary embodiment thereof.

I claim:

1. A circuit breaker testing apparatus, comprising:
   (a) an electrical circuit having leads terminated by electrical connectors for connection to terminals of a circuit breaker for providing a source of electrical power to said electrical circuit from the circuit breaker;
   (b) an adjustable inductor electrically connected in said electrical circuit for producing an adjustable electrical load on the circuit breaker;
   (c) means for sensing current flow in said electrical circuit;
   (d) indicator means electrically connected to said current sensing means for producing a reading of the magnitude of current flow in said electrical circuit and for displaying and holding the reading of the highest magnitude of current flow reached in said electrical circuit and thereby the magnitude of current flow at which the circuit breaker is tripped by the adjustment of the electrical load on the circuit breaker; and
   (e) means for adjusting said adjustable inductor so as to reduce the electrical load produced on the circuit breaker and thereby increase the magnitude of current flow drawn through the circuit breaker circuit to cause tripping of the circuit breaker.

2. The apparatus of claim 1 wherein said adjustable inductor includes:
   an electrical conductor coil electrically connected in said electrical circuit; and
   a ferromagnetic core spaced apart from said coil and being movable relative to said coil in first and second opposite directions so as to continuously vary the impedance to said flow of current through said coil in said electrical circuit until the circuit breaker is tripped.

3. The apparatus of claim 2 wherein said coil and core have respective axes extending in substantially parallel relation to one another and said core is movable relative to said coil along said axes.

4. The apparatus of claim 1 wherein said means for sensing said current flow in said electrical circuit includes a current transducer.

5. The apparatus of claim 4 wherein said indicator means includes a readout device electrically connected to said current transducer.

6. The apparatus of claim 5 wherein said indicator means further includes a direct current battery electrically connected to said readout device to provide a source of electrical power to operate said readout device.

7. The apparatus of claim 5 wherein said readout device is a digital display.

8. The apparatus of claim 1 wherein said adjusting means includes:
   a movable control knob; and
   a linkage connected to and extending between said control knob and said adjustable inductor such that selective moving of said control knob causes said linkage to adjust said adjustable inductor so as to decrease the impedance provided in said electrical circuit by said adjustable inductor and thereby increase the magnitude of current flow through said electrical circuit until the circuit breaker is tripped.

9. The apparatus of claim 8 wherein said linkage includes an insulator to prevent conduction of electricity from said adjustable inductor to said control knob.

10. The apparatus of claim 8 wherein said control knob is spring loaded to bias said adjustable inductor to a position at which said adjustable inductor produces a high impedance in said electrical circuit and thus a low magnitude of current flow in said electrical circuit.

11. The apparatus of claim 1 further comprising:

an on/off switch electrically connected in said electrical circuit and being adapted to selectively open and close said electrical circuit.

12. The apparatus of claim 1 further comprising:

(f) means for sensing current flow in an external electrical circuit connected to the circuit breaker in parallel with said electrical connectors of said electrical circuit of said apparatus such that the external electrical circuit provides a known normal electrical load on the circuit breaker and thus draws a known normal magnitude of current flow therethrough thereby requiring said adjustable inductor of said apparatus to only provide an electrical load sufficient to raise the magnitude of current flow from the known normal magnitude to a higher magnitude sufficient to cause tripping of the circuit breaker.

13. A circuit breaker testing apparatus, comprising:

(a) an electrical circuit having leads terminated by electrical connectors for connection to terminals of a circuit breaker for providing a source of electrical power to said electrical circuit from the circuit breaker;

(b) an adjustable inductor electrically connected in said electrical circuit for producing an adjustable electrical load on the circuit breaker, said adjustable inductor including (i) an electrical conductor coil electrically connected in said electrical circuit, and (ii) a ferromagnetic core spaced apart from said coil and being movable relative to said coil in first and second opposite directions so as to continuously vary the impedance to said flow of current through said coil in said electrical circuit until the circuit breaker is tripped;

(c) means for sensing current flow in said electrical circuit;

(d) indicator means electrically connected to said current sensing means for producing a reading of the magnitude of current flow in said electrical circuit and for displaying and holding the reading of the highest magnitude of current flow reached in said electrical circuit and thereby the magnitude of current flow at which the circuit breaker is tripped by the adjustment of the electrical load on the circuit breaker; and (e) means for adjusting said adjustable inductor so as to reduce the electrical load produced on the circuit breaker and thereby increase the magnitude of current flow drawn through the circuit breaker circuit to cause tripping of the circuit breaker, said adjusting means including (i) a movable control member, and (ii) a linkage connected to and extending between said control member and said core of said adjustable inductor such that moving said control member causes said linkage to move said core relative to said coil in one of said first and second opposite directions to decrease the impedance provided in said coil by said core and thereby allow the magnitude of current flow through said electrical circuit to increase until the circuit breaker is tripped.

14. The apparatus of claim 13 wherein said coil and core have respective axes extending in substantially parallel relation to one another and said core is movable relative to said coil along said axes.

15. The apparatus of claim 13 wherein said means for sensing said current flow in said electrical circuit includes a current transducer.

16. The apparatus of claim 13 wherein said indicator means includes:

a readout device electrically connected to said current transducer; and a direct current battery electrically connected to said readout device to provide a source of electrical power to operate said readout device.

17. The apparatus of claim 16 wherein said readout device is a digital display.

18. The apparatus of claim 13 wherein said linkage includes an insulator to prevent conduction of electricity from said core to said control knob.

19. The apparatus of claim 13 wherein said control member is a rotatable knob being spring loaded to bias said core to a position relative to said coil that produces a high impedance therein and thus a low magnitude of current in said electrical circuit.

20. The apparatus of claim 13 further comprising:

an on/off switch electrically connected in said electrical circuit and being adapted to open and close said electrical circuit.

* * * * *